US010662535B1

(12) United States Patent
Alnaser et al.

(10) Patent No.: US 10,662,535 B1
(45) Date of Patent: May 26, 2020

(54) DAMAGE SENSING OF A BONDED COMPOSITE REPAIR

(71) Applicant: The University of Tulsa, Tulsa, OK (US)

(72) Inventors: Ibrahim A. Alnaser, Tulsa, OK (US); Michael Keller, Tulsa, OK (US)

(73) Assignee: The University of Tulsa, Tulsa, OK (US)

( * ) Notice: Subject to any disclaimer, the term of this patent is extended or adjusted under 35 U.S.C. 154(b) by 38 days.

(21) Appl. No.: 16/034,826

(22) Filed: Jul. 13, 2018

Related U.S. Application Data

(60) Provisional application No. 62/532,044, filed on Jul. 13, 2017.

(51) Int. Cl.
  *C23F 13/22* (2006.01)
  *G01R 31/08* (2020.01)
(52) U.S. Cl.
  CPC .............. *C23F 13/22* (2013.01); *G01R 31/08* (2013.01)
(58) Field of Classification Search
  CPC .................................. C23F 13/22; G01R 31/08
  See application file for complete search history.

(56) References Cited

U.S. PATENT DOCUMENTS

| 4,970,467 | A | 11/1990 | Burnett |
| 6,194,902 | B1 | 2/2001 | Kuo et al. |
| 2018/0370854 | A1* | 12/2018 | Taha ............ C04B 26/02 |

FOREIGN PATENT DOCUMENTS

CN          201984108 U      9/2011

OTHER PUBLICATIONS

Tsamasphyros et al., Non-Destructive Testing of Bonded Composite Repairs Using Embedded Metallic Grids—Numerical Analysis, NDT for Safety, 2007 (Year: 2007).*
Chung, Self-monitoring structural materials, Materials Science and Engineering, R22, 1998 (Year: 1998).*
Alexander, Chris; Francini, Bob; State of the Art Assessment of Composite Systems Used to Repair Transmission Pipelines; Proceedings of IPC2006 6th International Pipeline Conference, Calgary, Alberta, Canada; Sep. 25-29, 2006.
Mally, Tim; Citadel Technologies, USA; Composite Comfort; World Pipelines; Mar. 2015.

* cited by examiner

*Primary Examiner* — Daniel R Miller
(74) *Attorney, Agent, or Firm* — Head, Johnson, Kachigian & Wilkinson, PC (57) ABSTRACT

A process to detect damage to a bonded composite repair of metal equipment. The process includes the steps of monitoring electrical resistance in a direct current impressed current cathodic protection circuit having a power supply and an anode in electrical communication with metal equipment having a bonded composite repair thereto. Deterioration of the bonded composite repair is detected based on a change in the electrical resistance of the circuit.

5 Claims, 11 Drawing Sheets

Prior Art

DAMAGE SENSING OF A BONDED COMPOSITE REPAIR

CROSS-REFERENCE TO RELATED APPLICATIONS

This application claims priority to and the benefit of U.S. Provisional Patent Application Ser. No. 62/532,044, filed Jul. 13, 2017, which is herein incorporated in its entirety by reference.

FEDERALLY SPONSORED RESEARCH OR DEVELOPMENT

This invention was developed with the assistance of a Department of Transportation grant (DTPH56-13-H-CAAP02). The U.S. Government may have rights in this invention.

BACKGROUND OF THE INVENTION

Field of the Invention

The present invention is directed to a process and system to detect damage to a bonded composite repair of metal equipment. In particular, the present invention is directed to detecting damage in a bonded composite repair of metal equipment by monitoring electrical resistance using an existing cathodic protection system.

Description of the Related Art

Among other applications, composite metal repairs have proven effective for pressurized metal pipelines and other metal pressure vessels. Traditional repair methods for pressurized metal pipelines include cutting out and replacing a section of the damaged pipe or welding steel sleeves around the damaged pipe. These traditional repair methods have several disadvantages.

A first disadvantage is that heat induced on the pipe during the welding process can reduce the strength of the pipe. Second, traditional methods require highly trained labor including welders which increase the cost of the repair. Composite repair systems avoid these issues by not requiring welding to be done to the pipe during the repair process. A third disadvantage of these methods is that they require the pressure to be reduced in the pipeline or the pipeline to be completely shut down during repairs. Shutting down or reducing the pressure in the pipeline forces the pipeline operator to incur production losses and has a negative effect on the environment in that the gas released from the pipeline is typically released into the atmosphere. Composite repair systems do not require the pipeline to be shut down or the pressure to be reduced in the pipeline which eliminates these concerns. For all of the foregoing reasons, the use of composite repair materials to repair damaged metal equipment has increased substantially over the past fifty to sixty years.

There are a number of different types of composite repair systems. Layered systems involve bonding of precured materials held together with an adhesive applied in the field. Additionally, wet lay-up systems typically involve fiberglass, carbon fiber, or other types of reinforcement cloth which is saturated or activated in the field. In each system, fibers provide strength and stiffness while a resin transfers load between fibers.

Today, composite repair systems are widely used in the pipeline and pressure vessel industries. Bonded composite repairs are known to be as strong as or stronger than the original metal material repaired.

Despite the strong reputation of composite repairs to restore the integrity of the pipeline or pressure vessel, operators of pressurized metal pipelines and other metal pressure vessels test their repairs to demonstrate reliability and to meet governmental and industry requirements. Some methods of testing composite repairs include fatigue tests and burst tests. These tests, however, may permanently alter the repair.

Various non-destructive evaluation (NDE) methods are used for finding defects in a composite repair. In order to evaluate the effectiveness of these methods, it must first be understood that there are three primary locations of a defect in a composite repair. Defects can be found in the repaired metal itself, in the bond line between repaired metal and the composite material, or in the composite material itself.

The phased array ultrasonic testing method uses a transducer probe to emit a sound wave into an area of the repair. The sound wave will echo back at each surface it hits until it reaches the pipe at which point the sound wave will fully echo back to the probe. Multiple echoes received by the probe indicate that there are voids either between layers in the composite material or between the composite and the metal. While this method is effective at evaluating the state of the repair, it requires access to the area of the metal that has been repaired which can be difficult if the metal pipeline or vessel is underground or underwater.

The electromagnetic acoustic transducer (EMAT) method uses the electromagnetic waves produced by a transmitter and the material being tested to produce a soundwave that travels the length of the pipe. Said sound wave can be analyzed to identify defects in the metal and defects between the composite material and the metal. While the EMAT method can be used without having direct access to the repaired area of the metal, neither the EMAT method nor the phased array method reveal deficiencies in all three primary locations of potential defects.

The pulsed eddy current evaluation method uses a transmitter to induce an alternating current in the nearby repaired metal. This method is primarily used to indicate that the wall of the metal has grown thin. Where the wall of the metal is thin the eddy current in the metal weakens which reduces the current in the transmitter. This method can only detect defects in the metal and is typically used in conjunction with other evaluation methods.

The radiography method transmits X-rays or gamma rays from a transmitter, through the area of the metal being tested, and to a receiver on the other side of the material. This method only captures separation defects in the 2-dimensional plane between the transmitter and receiver, therefore, the machine must be fully rotated around the area being tested in order to fully test the repair. This method is quite expensive, requires access to the tested area, and requires a great deal of safety precautions.

The last two methods used to inspect the integrity of composite repairs can only be used to find defects within the composite material itself or defects in the bond between the composite material and the metal. The first uses microwaves in a similar fashion to the phased array method. A transmitter transmits microwaves toward the material to be tested and monitors the reflected waves to find defects. The second method uses an infrared camera to measure heat dissipation discrepancies as the tested area is heated by a separate mechanism. Voids such as separations within the composite material or separations between the composite material and the metal will dissipate heat at a different rate than solid material without voids. These two methods are complicated and require a large amount of equipment in order to be performed.

Periodic visual inspections are also available but like most other evaluation methods are unable to detect all damages. Due to the limitations of each NDE method, another type of non-destructive evaluation method would be advisable and preferred.

As a separate matter, cathodic protection is a known technique used to control corrosion of metal equipment. Electrochemical protection is provided by decreasing the corrosion potential in order to decrease the corrosion rate of metal. The metal equipment itself functions as a cathode for an electrical circuit. The corrosion rate of metal equipment is thereby significantly reduced.

Figure 1:
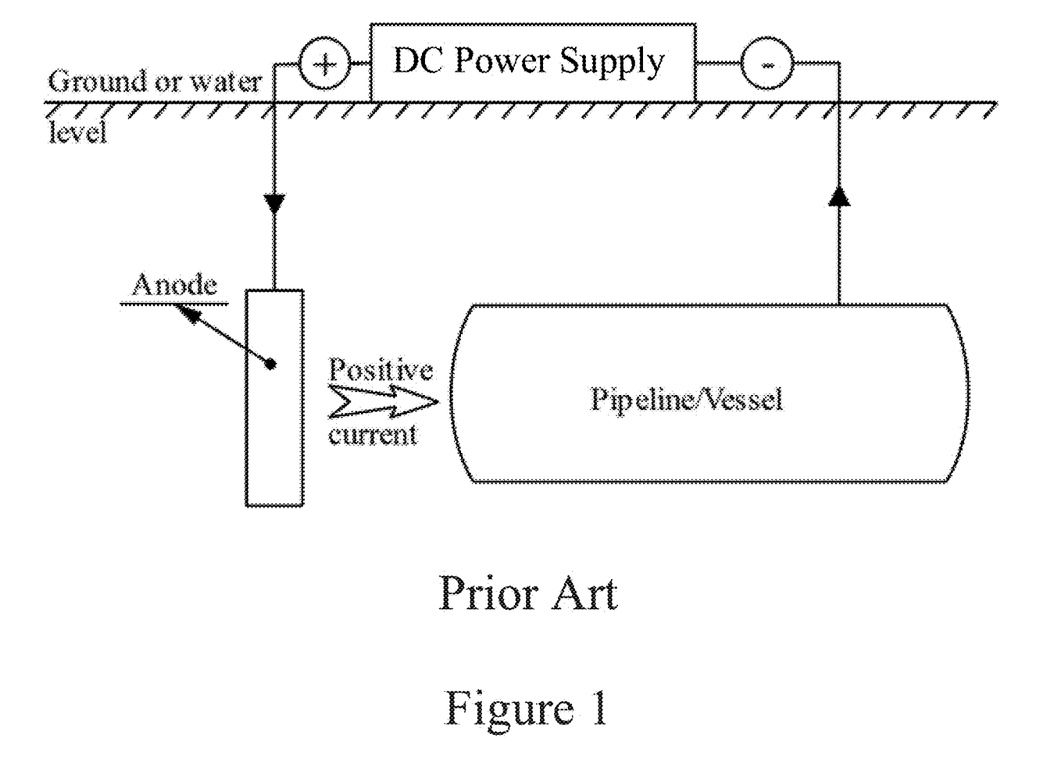
FIG. 1 illustrates a simplified diagram of a known impressed current cathodic protection system (ICCP) for a pipeline.

One type of cathodic protection system is an impressed current cathodic protection system (ICCP) which includes an anode or anodes connected to a direct current (DC) power source. Wind, solar, or other natural power sources that feed a battery could be used as energy sources for ICCP. Alternating current (AC) or DC transmission/pylon tower are other energy sources of ICCP. In the case of AC transmission/pylon tower, a rectifier is used to convert AC electrical power to DC power. Cathodic protection systems are used to protect a wide range of metal equipment. FIG. 1 illustrates a simplified diagram or schematic of a metal pipeline for a known ICCP system. A direct current (DC) from a power supply is impressed on or connected to the pipeline, tank, ship, or any metal structure in order to drive corrosion to an anode. The anode or anodes are buried in or below ground, or attached to a metal structure. The current passes from the power supply to the anode through ground to the pipeline and back to the power supply. The current levels in these systems are relatively high (sometimes hundreds of amps).

Previous attempts have been made to ascertain defects in pipelines.

Burnett (U.S. Pat. No. 4,970,467) describes a system for ascertaining the existence and location of defects in an underground pipeline. Burnett does so by emitting two electrical pulses towards each other from each end of a pipe. The pulses meet and join at a point along the pipe set by the timing of the pulses. If the pulses meet at a point where the pipe has a defect, the joined pulse will reach the receiver at a different velocity than if the pipe did not have a defect at the point of intersection. Burnett differs from the present invention in that the present invention measures DC current to monitor changes in the resistance of the circuit in order to find defects, but Burnett relies on two electrical pulses to monitor discrepancies in the velocity of the pulses in order find defects in the pipeline. Further, Burnett does not find defects in the composite repairs of the pipeline, but merely the pipeline itself.

Kuo et al. (U.S. Pat. No. 6,194,902) describes a similar system to Burnett. The same distinguishing factors that exist between Burnett and the present invention, also exist between Kuo and the present invention.

Notwithstanding the foregoing, it is an object and purpose of the present invention to provide a process and system to detect damage of a bonded composite repair by monitoring change in electrical resistance in an electrical circuit.

It is a further object and purpose of the present invention to detect damage of a bonded composite repair by monitoring change in electrical resistance in an existing cathodic protection system.

SUMMARY OF THE INVENTION

The present invention is directed to a process and system to detect damage to a bonded composite repair of metal equipment, such as a metal pressure vessel, ship, or any metal structure with an attached impressed current cathodic protection (ICCP) system. The process of the invention includes the steps of monitoring electrical resistance in a direct current circuit having a power supply and an anode in electrical communication with metal equipment having a bonded composite repair thereto. Deterioration of the bonded composite repair is detected based on a change in electrical resistance. In particular, an increase in resistance in the circuit is monitored.

In one non-limiting example, an existing impressed current cathodic protection circuit is utilized wherein the impressed current cathodic protection circuit includes an anode having a negative side connected to the metal equipment.

The bonded composite repair itself includes conductive composite materials, such as, but not limited to, carbon fibers or additional material used to make the bonded composite repair conductive.

Deterioration of the bonded composite repair may be detected based on a change in electrical resistance of the circuit.

DETAILED DESCRIPTION OF THE INVENTION

The embodiments discussed herein are merely illustrative of specific manners in which to make and use the invention and are not to be interpreted as limiting the scope.

While the invention has been described with a certain degree of particularity, it is to be noted that many modifications may be made in the details of the invention's construction and the arrangement of its components without departing from the scope of this disclosure. It is understood that the invention is not limited to the embodiments set forth herein for purposes of exemplification.

The present invention provides a process and system to detect damage to a bonded composite repair of metal equipment.

Figure 2:
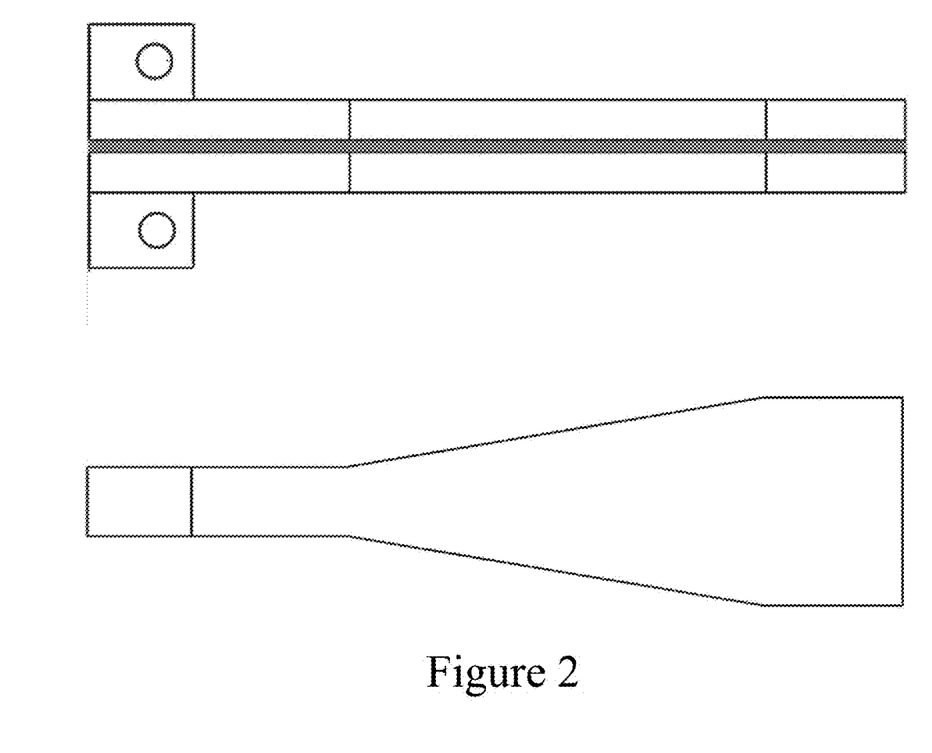
FIG. 2 illustrates a top view and side view of a width-tapered-double-cantilevered beam used to test the invention.
Figure 3:
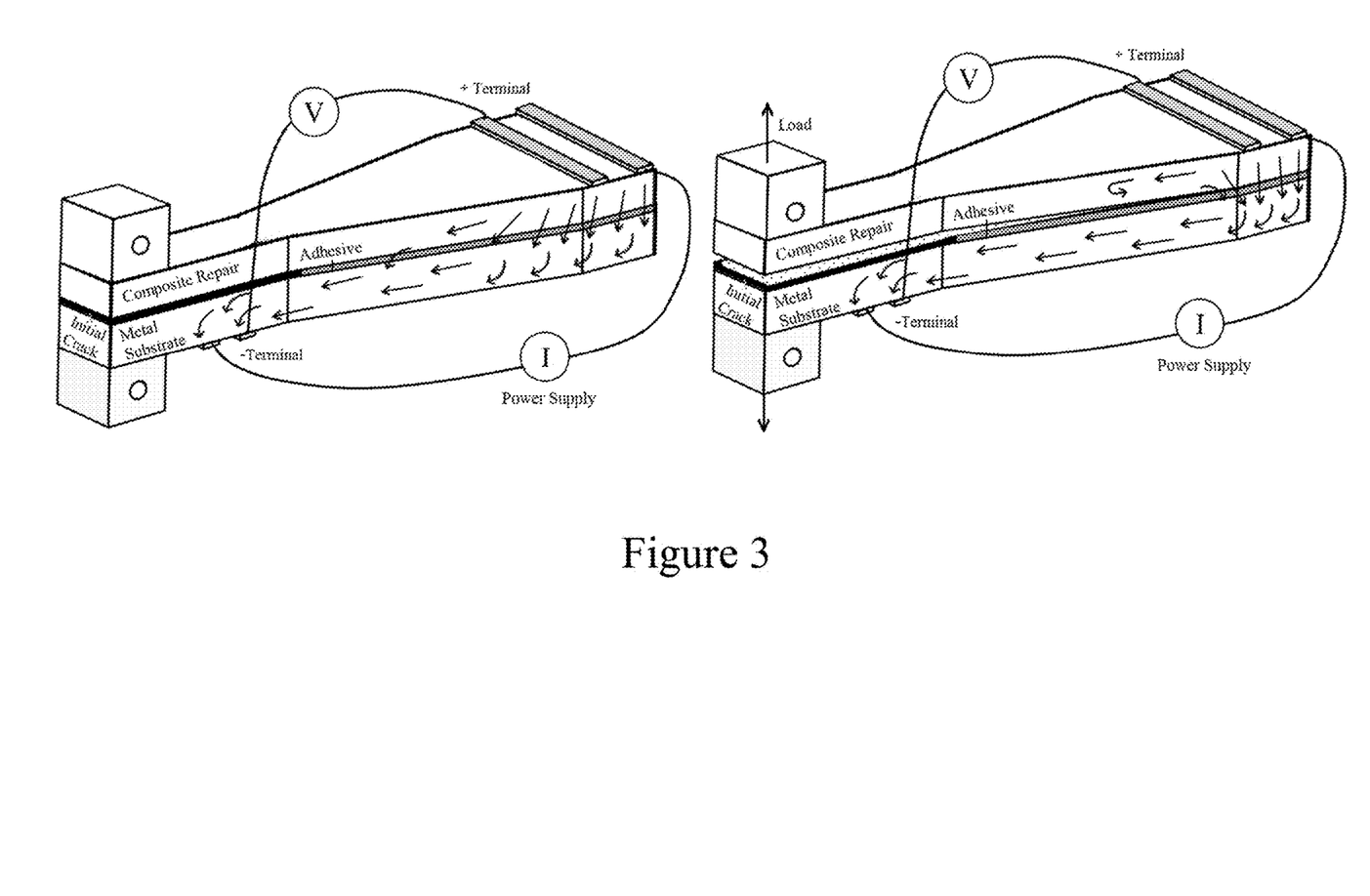
FIG. 3 illustrates simplified diagrams of width-tapered-double-cantilevered beam specimens representing increase in crack length used to test the invention.

To verify the process and system, a small prototype known as a width-tapered-double-cantilevered beam (WTDCB) specimen was created to simulate the real field of bonded composite repair systems of metal pressure vessel equipment, ship, or any metal structure. A schematic of a top and side view of a WTDCB specimen is shown in FIG. 2. The WTDCB specimen contains steel adherent which represents a wall of metal pressure vessel equipment, and composite adherent which represents the bonded composite repair that is made of carbon fibers and wet-out material. The carbon fibers are conductive so that the electrical resistance changes during quasi-static and fatigue tests, enabling the in-situ inspection of defects in a composite. The resistance measurements increase when the crack length increases because as crack length gets larger, the contact between the adherent and substrate is reduced, which simulates de-bond damage, as shown in the diagrams in FIG. 3. A fiber break inside a composite adherent increases the resistance measurement due to disconnect.

Figure 4:
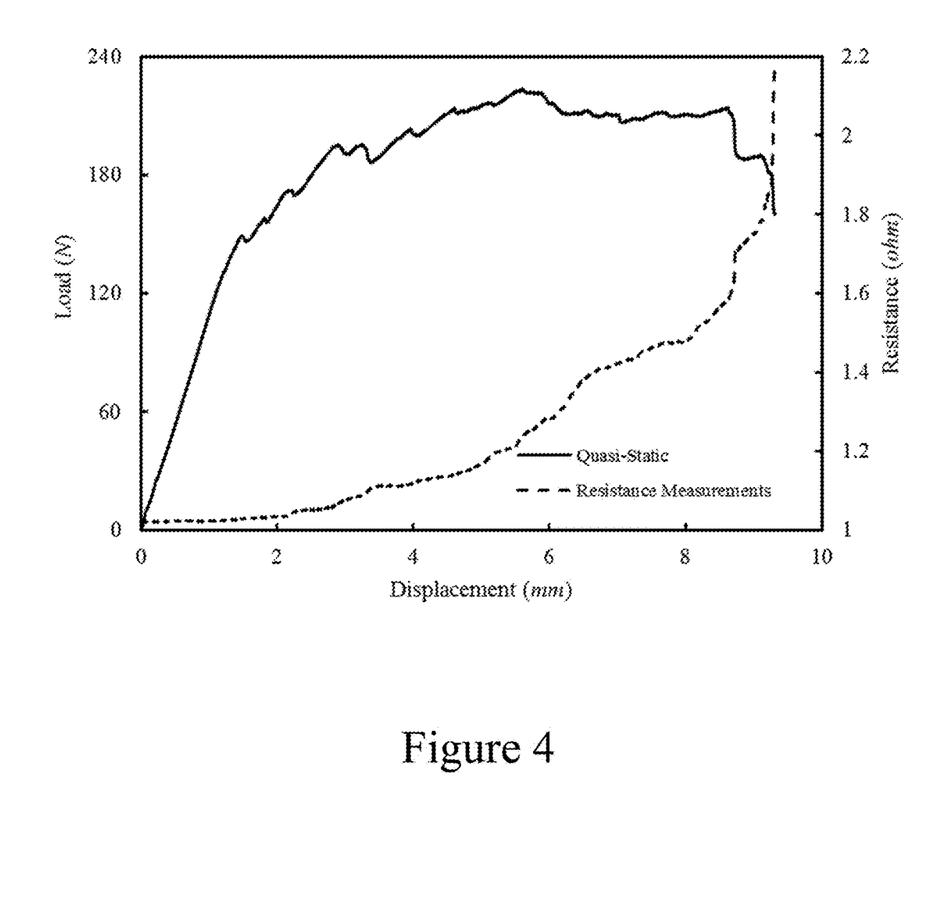
FIG. 4 illustrates a chart or graph showing applied load and electrical resistance measurements versus displacement changes.

For quasi-static testing, a constant current was applied using a laboratory power supply and a LabVIEW™ program measured the resistance change during the test. The chart or graph in FIG. 4 shows the applied load in newtons and the resistance measurements in ohms versus the vertical displacement in mm of the WTDCB specimen during a quasi-static test. The applied load and the resistance are shown on vertical axes while the displacement is shown on the horizontal axis. As the applied load curve increases, the resistance curve increases as well, which verifies that electrical resistance increases with displacement.

Figure 5:
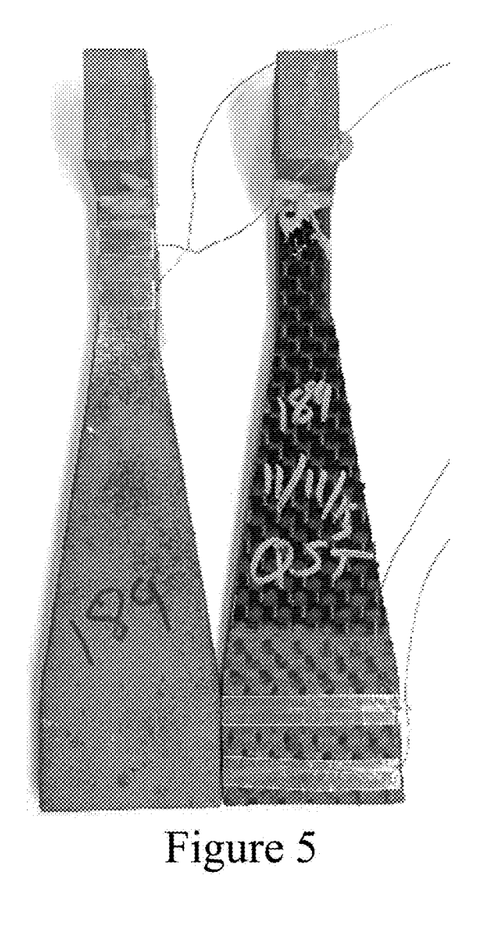
FIG. 5 illustrates an image of a width-tapered-double-cantilevered beam specimen used to test the invention.

FIG. 5 shows an image of a WTDCB specimen with the system of resistance wires. Aluminum conductive tape was used to attach the wires to specimen.

In addition to confirming that the resistance monitoring approach works, a fatigue test was performed to simulate a field operation of bonded composite repair. These changes can predict, or warn, when a composite has been damaged and might fail.

Figure 6:
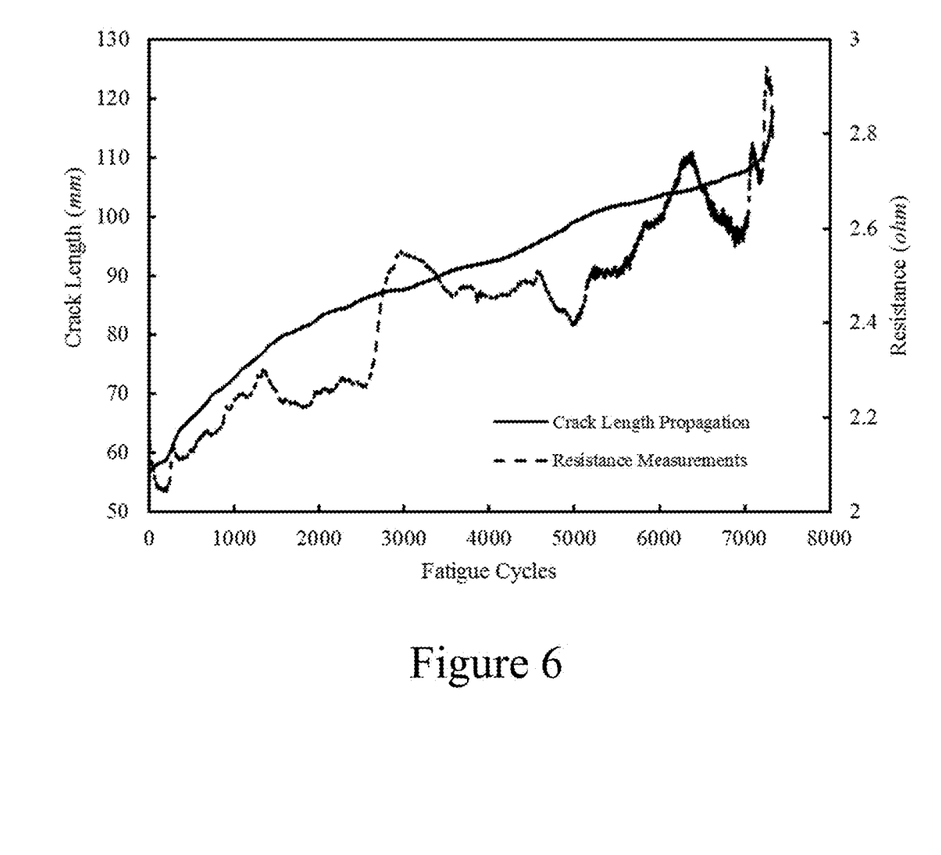
FIG. 6 illustrates a chart or graph of crack length propagation and resistance measurements versus fatigue cycles.

FIG. 6 is a chart or graph of crack length propagation in millimeters and resistance measurements in ohms versus the fatigue cycles for a fatigue test. The crack length in millimeters and the resistance in ohms are shown on vertical axes while the fatigue cycles are shown on the horizontal axis. The resistance measurement increases as the crack length increases over fatigue cycles as shown in FIG. 6. The behavior of the resistance measurements confirms how the resistance measurement behaves when fatigue cycles increase.

A correlation between crack length and electrical resistance has accordingly been shown.

In summary, detection of damage of a bonded composite repair of metal equipment is detected by a change in resistance of an existing cathodic protection circuit system.

Figure 7:
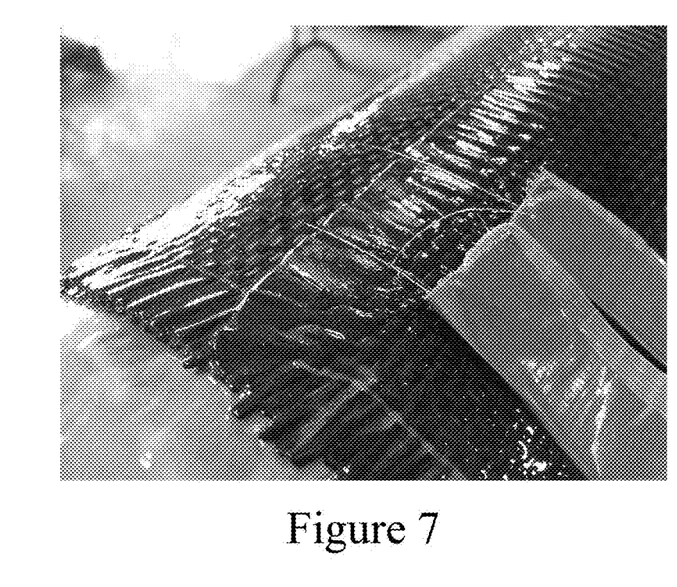
FIG. 7 illustrates a graphic image of installation of a repair utilizing the present invention including use of a bare copper wire on an outer surface of the repair.

FIG. 7 illustrates a graphic image of installation and construction of a bonded composite repair utilizing the present invention including use of a conductive wire, such as a bare copper wire, on an outer surface of the composite repair.

Figure 8:
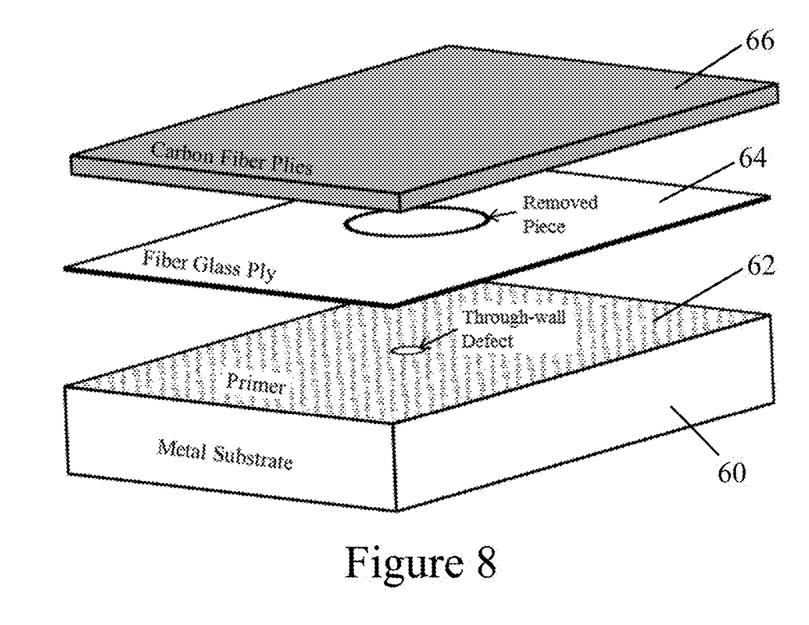
FIG. 8 is an exploded view of a bonded composite repair constructed for testing of the present invention.

FIG. 8 illustrates an exploded view of a bonded composite repair constructed for testing of the present invention. A metal substrate 60 simulating metal equipment was prepared with a through-wall defect such as a hole to simulate an actual metal vessel hole or defect. A conductive primer 62 was applied to the top surface of the metal equipment to be repaired. Alternatively, a non-conductive primer to which conductive material, such as carbon black, has been added might be used. Thereafter, a non-conductive fiber 64, such as fiberglass, was applied thereon.

Thereafter, a conductive fiber 66, such as carbon fiber, was laid down on top of the non-conductive fiber 64.

Figure 9:
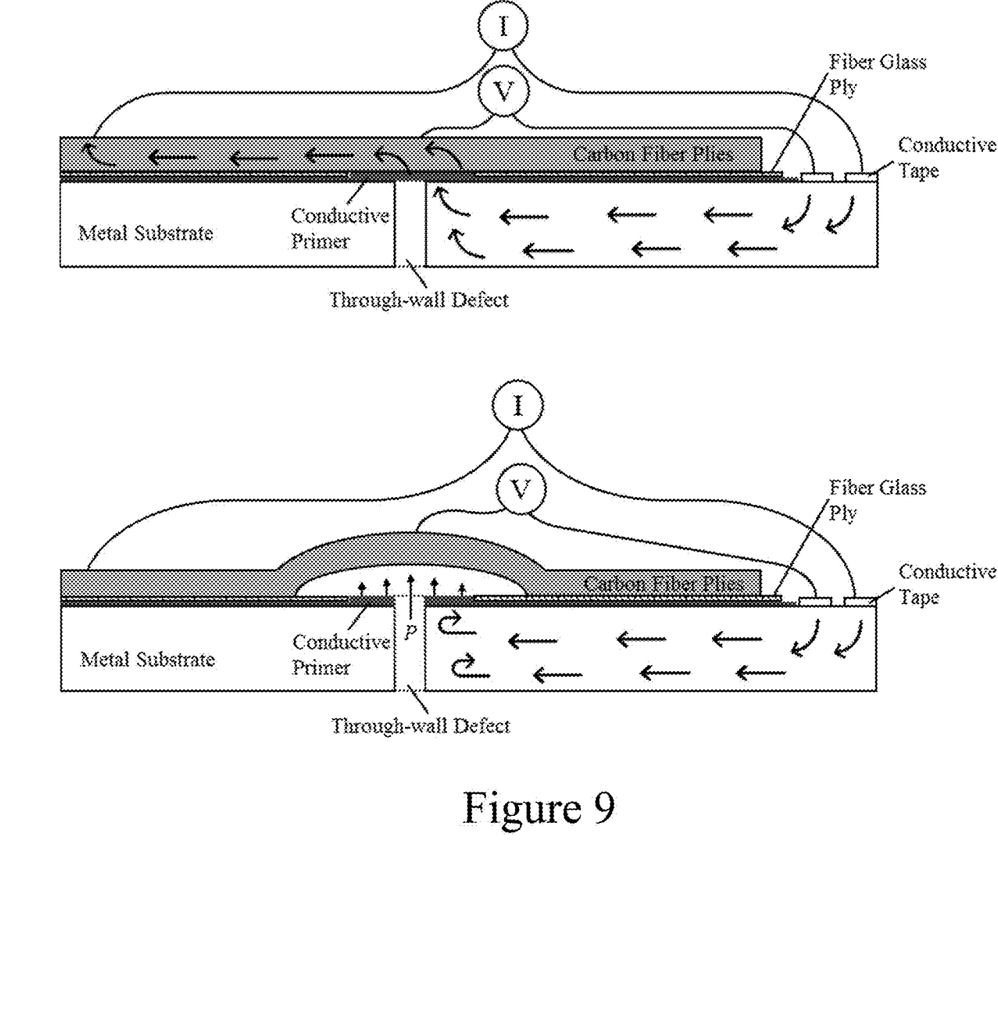
FIG. 9 are simplified drawings showing a bonded composite repair constructed for testing before damage and after damage to the bonded composite repair.

FIG. 9 illustrates two simplified drawings showing a bonded composite repair, such as shown in FIG. 8, before damage to the bonded composite repair and after damage to the bonded composite repair. The upper drawing illustrates flow of current before defect in the bonded composite repair. The lower drawing shows current flow when a defect, such as a blister area, has propagated in the composite repair. The flow of voltage is altered due to defect in the composite repair.

Figure 10:
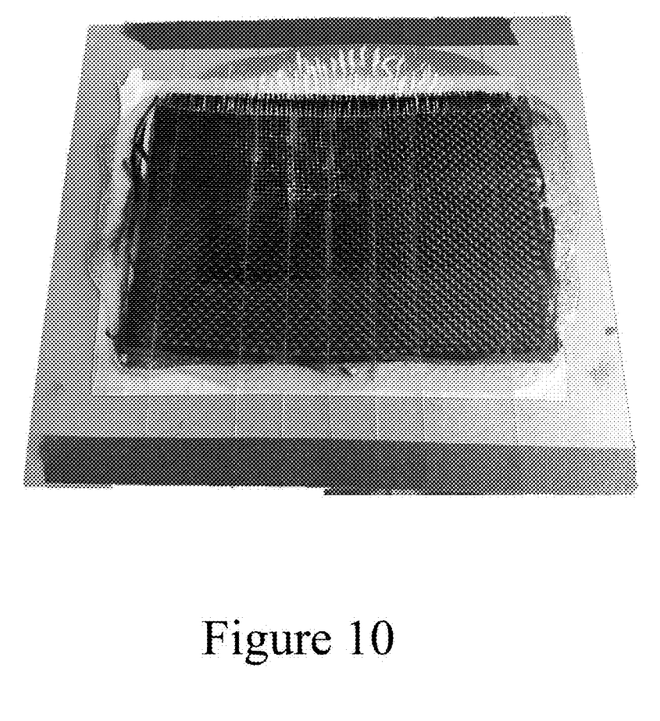
FIG. 10 is a graphic image of a bonded composite repair including embedded sensing wires for damage sensing.

FIG. 10 illustrates a graphic image of a bonded composite repair including embedded sensing wires.

Figure 11:
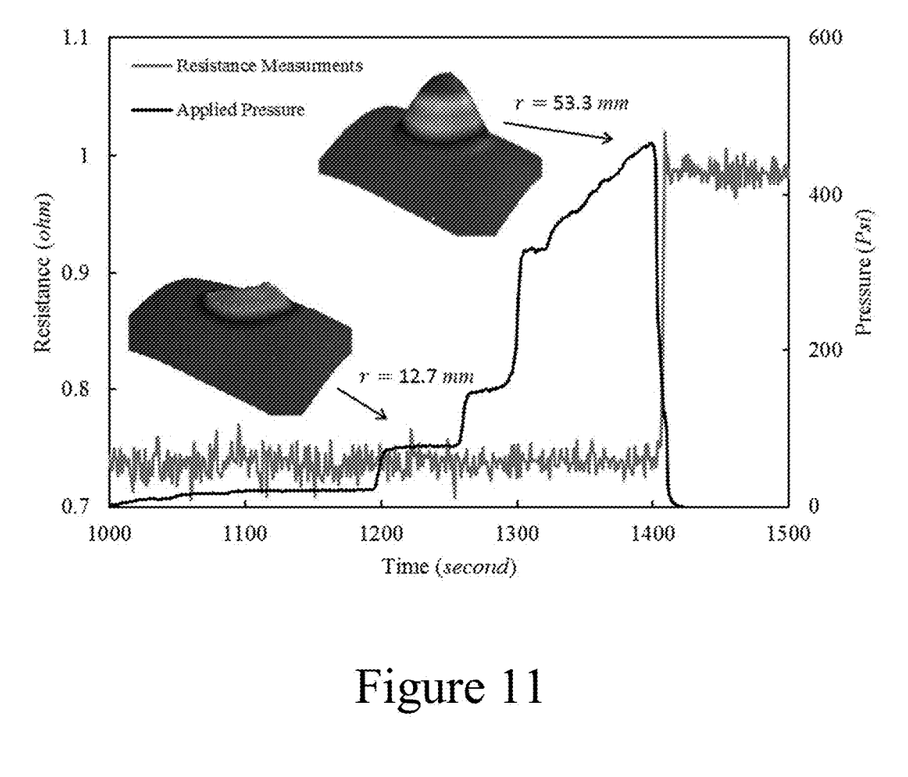
FIG. 11 illustrates a chart or graph showing voltage and pressure measurements versus time.

FIG. 11 illustrates a chart or a graph showing voltage and pressure measurements versus time in seconds. The voltage change is shown due to growth of a blister or defect in the simulated pipe repair. Oil was introduced through the hole in the metal substrate and then pressurized using a pump until failure. The plot shows the applied pressure and the measured voltage drop across two of the wires in the simulated system. The plot shows an increase in voltage drop as the blister expands.

The invention may be enhanced by including an alarm in the event resistance changed outside of set parameters, such as a range of parameters.

The invention could further be enhanced by including an algorithm to eliminate false positives, such as from stray electrical fields generated by a local AC power source, for example.

Whereas, the invention has been described in relation to the drawings attached hereto, it should be understood that other and further modifications, apart from those shown or suggested herein, may be made within the scope of this invention.

What is claimed is:

1. A process to detect damage to a bonded composite repair of metal equipment, which process comprises:
    monitoring electrical resistance in an impressed direct current cathodic protection circuit having a power supply and an anode having a negative side connected to and in electrical communication with metal pressure vessel equipment having a bonded composite repair thereto wherein said bonded composite repair includes conductive composite materials having carbon fibers; and
    detecting deterioration of said bonded composite repair and detecting deterioration of contact between said composite repair and said metal pressure vessel equipment based on detection of a change in said electrical resistance.

2. The process as set forth in claim 1 wherein said change in resistance is an increase in resistance.

3. The process as set forth in claim 1 wherein said impressed direct current cathodic protection circuit is an existing cathodic protection system for said metal pressure equipment.

4. The process as set forth in claim 1 wherein said bonded composite repair includes a layer of non-conductive fiber and a layer of said conductive composite materials.

5. The process as set forth in claim 1 including the additional step of activating an alarm if said change in electrical resistance is outside of set parameters.

\* \* \* \* \*